(12) United States Patent
Hsieh

(10) Patent No.: US 9,585,295 B2
(45) Date of Patent: Feb. 28, 2017

(54) ELECTRONIC COMPONENT REMOVAL APPARATUS FOR A CIRCUIT BOARD

(71) Applicant: Wistron Corporation, New Taipei (TW)

(72) Inventor: Cheng-Yang Hsieh, New Taipei (TW)

(73) Assignee: Wistron Corporation, New Taipei (TW)

( * ) Notice: Subject to any disclaimer, the term of this patent is extended or adjusted under 35 U.S.C. 154(b) by 266 days.

(21) Appl. No.: 14/273,797

(22) Filed: May 9, 2014

(65) Prior Publication Data

US 2015/0163970 A1    Jun. 11, 2015

(30) Foreign Application Priority Data

Dec. 9, 2013  (TW) ............................. 102145170 A

(51) Int. Cl.
| | |
|---|---|
| *H05K 13/04* | (2006.01) |
| *B23P 19/04* | (2006.01) |
| *B23P 19/00* | (2006.01) |
| *B65G 23/44* | (2006.01) |
| *B65B 23/02* | (2006.01) |

(Continued)

(52) U.S. Cl.
CPC ........ *H05K 13/0486* (2013.01); *B23P 19/001* (2013.01); *B23P 19/04* (2013.01); *H05K 13/0417* (2013.01); *B65B 23/02* (2013.01); *B65B 23/06* (2013.01); *B65G 23/44* (2013.01);

(Continued)

(58) Field of Classification Search
CPC ............ H05K 13/0486; H05K 13/0417; B23P 19/001; B23P 19/04; B65B 23/02; B65B 23/06; B65B 23/44; H02K 16/00; B65G 23/44; Y10T 29/53274

See application file for complete search history.

(56) References Cited

U.S. PATENT DOCUMENTS

| | | | | |
|---|---|---|---|---|
| 4,780,040 A | * | 10/1988 | Petersen ................ | B65G 23/44 198/817 |
| 5,715,592 A | * | 2/1998 | Mori .................. | H05K 13/0486 228/191 |
| 2006/0087186 A1 | * | 4/2006 | Wasson .................. | H02K 16/00 310/114 |

FOREIGN PATENT DOCUMENTS

| | | |
|---|---|---|
| CN | 101733631 A | 6/2010 |
| JP | 2005044828 A  * | 2/2005 |

OTHER PUBLICATIONS

Office Action issued to Chinese Counterpart Application No. 201310739816.1 by the State Intellectual Property Office of the P.R.C. on Mar. 2, 2016 along with an English translation of sections boxed in red.

(Continued)

*Primary Examiner* — A. Dexter Tugbang
(74) *Attorney, Agent, or Firm* — The Mueller Law Office, P.C.

(57) ABSTRACT

A removal apparatus includes a main body, a carrying device, a heating device and a brush device. The carrying device is disposed on the main body, and includes a holding module for holding a circuit board. The heating device is disposed on the main body for heating up the circuit board to melt bonding material that bonds electronic components and a board body of the circuit board. The brush device is disposed on the main body, and includes at least one brush body that is made of heat-resistant material, and that is operable to move relative to a surface of the circuit board to remove the electronic components from the board body after the bonding material are melted.

12 Claims, 5 Drawing Sheets

(51) Int. Cl.
  *B65B 23/06* (2006.01)
  *H02K 16/00* (2006.01)
(52) U.S. Cl.
  CPC ......... *H02K 16/00* (2013.01); *Y10T 29/53274* (2015.01)

(56) References Cited

OTHER PUBLICATIONS

Office Action issued to Taiwanese Counterpart Application No. 102145170 by the Taiwan Intellectual Property Office on Jul. 23, 2015 along with an English translation of sections boxed.

\* cited by examiner

ELECTRONIC COMPONENT REMOVAL APPARATUS FOR A CIRCUIT BOARD

CROSS-REFERENCE TO RELATED APPLICATION

This application claims priority of Taiwanese Application No. 102145170, filed on Dec. 9, 2013, the disclosure of which is incorporated herein by reference.

BACKGROUND OF THE DISCLOSURE

1. Field of the Disclosure

The disclosure relates to a recycle apparatus for electronic wastes, more particularly to an electronic component removal apparatus for a circuit board.

2. Description of the Related Art

Along with the booming electronic industry came the significant environmental issue of the disposal of electronic wastes. Luckily, most electronic wastes are currently capable of being recycled.

In recycling a discarded circuit board, the circuit board is first cut into pieces with an adequate size. Then the board pieces are crushed into smaller fragments, and are ground into powder. Finally, the powder is divided into metal powder and plastic powder for different uses.

However, in the cutting, crushing and grinding operations of the abovementioned recycling process, the cutters are easily worn by stiff electronic components of the circuit board, and need to be replaced frequently.

SUMMARY OF THE DISCLOSURE

Therefore, the object of the present disclosure is to provide a removal apparatus that is adapted for removing electronic components of a discarded circuit board to obtain a bare board before the bare board is cut into board pieces, such that the cutters for subsequently treating the bare board would have prolonged service lives.

Accordingly, a removal apparatus of the present disclosure is adapted for removing electronic components from a board body of a circuit board. The removal apparatus includes a main body, a carrying device, a heating device and a brush device. The carrying device is disposed on the main body, and includes a holding module that is adapted for holding the circuit board thereon. The heating device is disposed on the main body, is proximate to the carrying device, and is adapted for heating up the circuit board to melt bonding material that bonds the electronic components and the board body. The brush device is disposed on the main body, is proximate to the carrying device, and includes at least one brush body that is made of heat-resistant material, and that is operable to move relative to a surface of the circuit board to remove the electronic components from the board body after the bonding material is melted.

BRIEF DESCRIPTION OF THE DRAWINGS

Other features and advantages of the present disclosure will become apparent in the following detailed description of the embodiment with reference to the accompanying drawings, of which.

DETAILED DESCRIPTION OF THE EMBODIMENT

Figure 1:
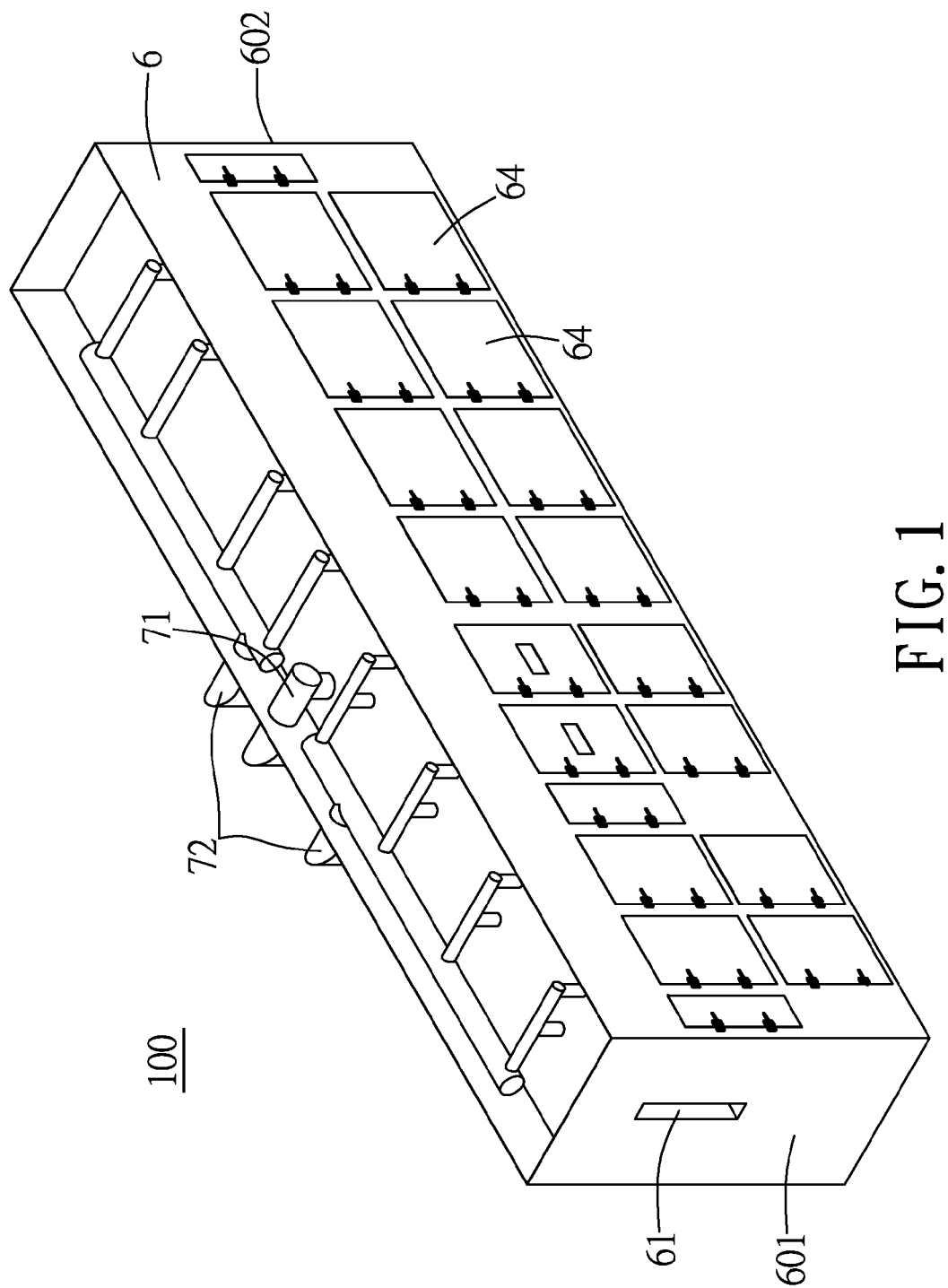
FIG. 1 is a perspective view of an embodiment of a removal apparatus according to the disclosure.
Figure 2:
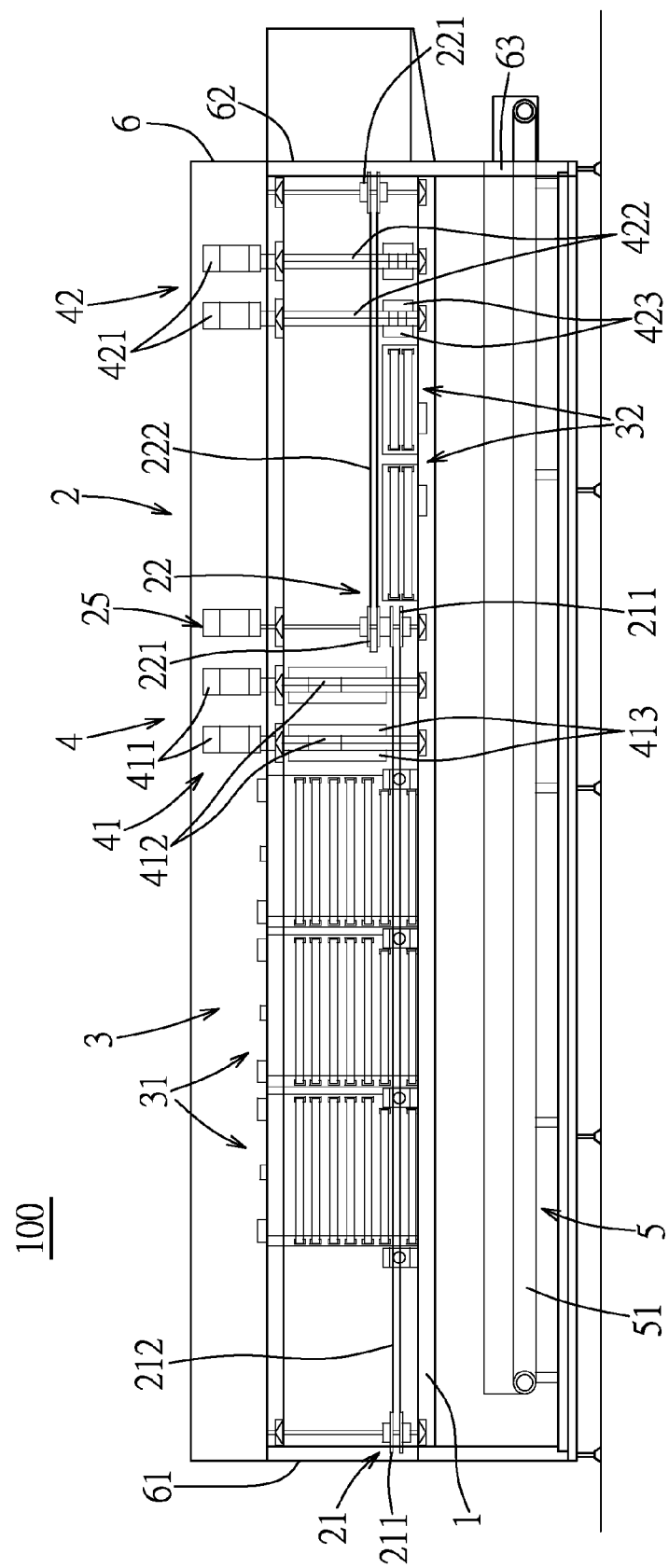
FIG. 2 is a sectional view of the embodiment.

As shown in FIGS. 1 and 2, an embodiment of a removal apparatus 100 according to the present disclosure is adapted to pretreat a discarded circuit board 9 (see FIG. 3) to remove electronic components 91 (see FIG. 3) of the circuit board 9 to obtain a bare board. As such, in following recycling processes of the bare board, cutters (not shown) would not be easily worn by treating the bare board.

The embodiment of the removal apparatus 100 includes an elongated main body 1, a carrying device 2 disposed on the main body 1 for carrying and conveying the circuit board 9, a heating device 3 for heating up the circuit board 9, a brush device 4 for removing the electronic components 91 of the circuit board 9, a receiving device 5 disposed under the heating device 3 and the brush device 4 for receiving the removed electronic components 91, a housing 6 containing the abovementioned devices 1-5, a cooling device 71 provided on the housing 6 for cooling the heating device 3, and a ventilating device 72 provided on the housing 6 for expelling waste gas from the housing 6.

The housing 6 has one end (referred to as front end 601 hereinafter) that is formed with an elongated inlet 61, and an opposite end (referred to as rear end 602 hereinafter) that is formed with an elongated board outlet 62 and a gathering outlet 63 disposed below the board outlet 62. Two guiding devices (not shown) may be respectively provided and located downstream of the board outlet 62 and the gathering outlet 63 for facilitating discharge of the bare board and the removed electronic components 91. For observation and maintenance of the removal apparatus 100, the housing 6 is further formed with a plurality of openings (not visible), and the removal apparatus 100 further includes a plurality of covering plates 64 that are operable to cover the openings, respectively.

Figure 3:
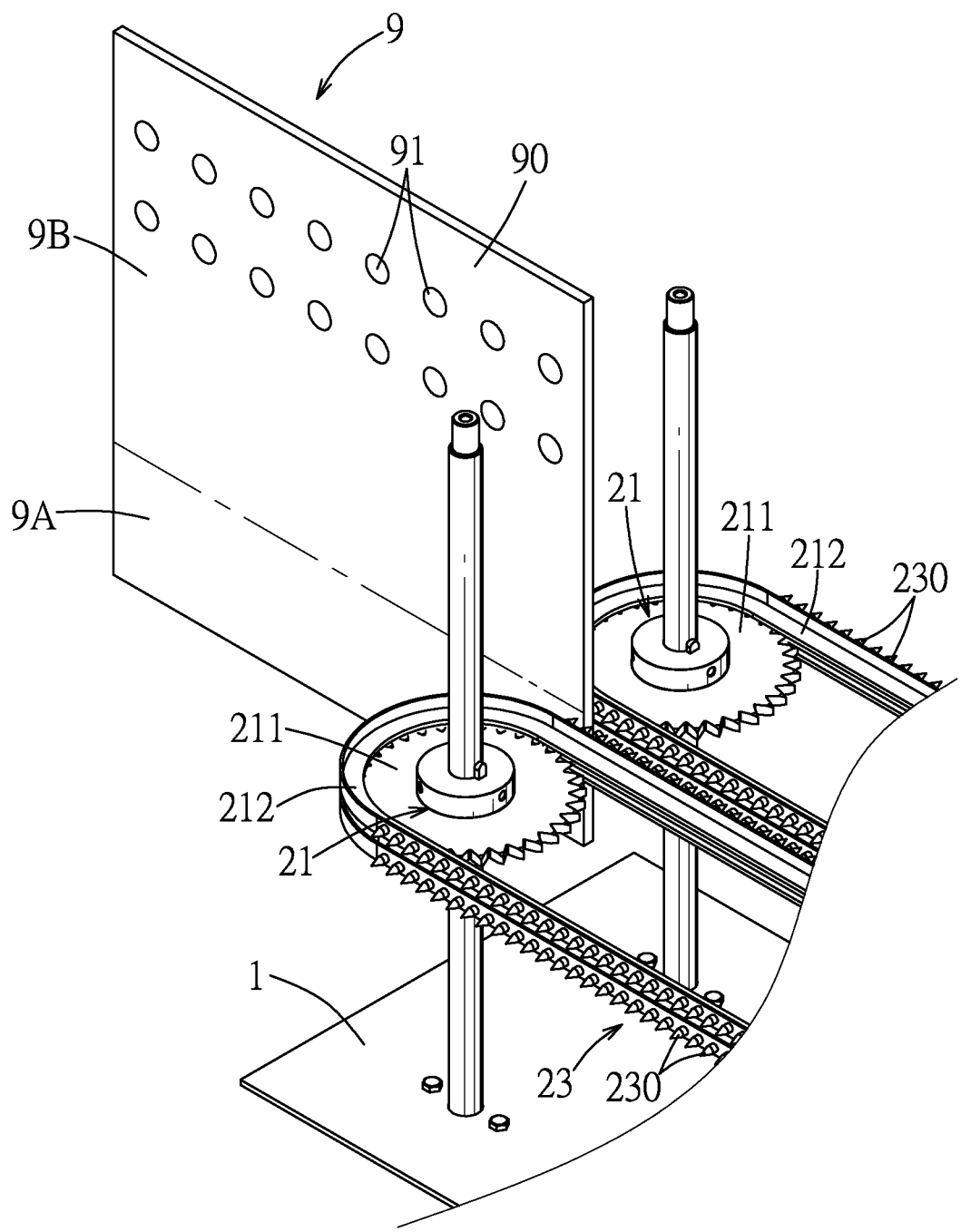
FIG. 3 is a fragmentary perspective view, illustrating a pair of first transmission modules of the embodiment clamping a circuit board.

Referring further to FIG. 3, the circuit board 9 includes a board body 90 (i.e., the bare board) mounted with the electronic components 91. The circuit board 9 is conveyed in a conveying direction (the front-rear direction of the housing 6) by the carrying device 2 after being fed into the removal apparatus 100 via the inlet 61. After the electronic components 91 have been removed from the board body 90, the board body 90 exits the removal apparatus 100 via the board outlet 62. In this embodiment, for completely removing the electronic components 91 from the board body 90, the removal of the electronic components 91 is divided into first and second stages. In the first stage, most of the electronic components 91 are removed, and in the second stage, the remaining electronic components 91 are removed. It is noted that, in accordance with different requirements, the removal of the electronic components 91 may have only one stage for removing a majority of the electronic components 91, or may have more than two stages with ones of the electronic components 91 on a predetermined region of the board body 90 being removed in each stage.

Figure 4:
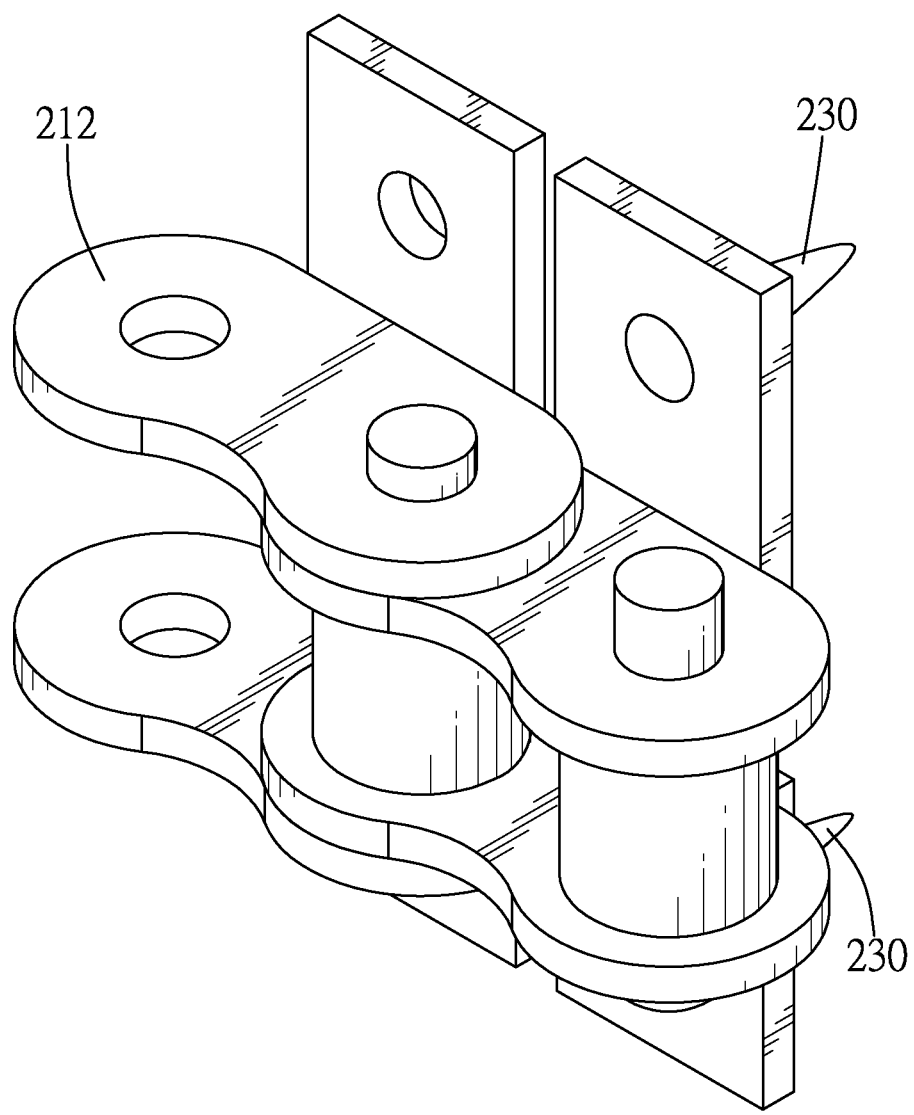
FIG. 4 is an enlarged perspective view of a portion of a chain of one of the first transmission modules.

The carrying device 2 includes a pair of first transmission modules 21 (see FIG. 3) that are proximate to the front end 601 of the housing 6, and a pair of second transmission modules 22 (only one is visible in FIG. 2) that are proximate to the rear end 602 of the housing 6. Referring to FIGS. 2, 3 and 4, each of the first transmission modules 21 includes a plurality of toothed discs 211 that are mounted fixedly on the main body 1 and that are rotatable respectively about central axes thereof, and a chain 212 that is trained on the toothed discs 211 and that is driven to rotate relative to the main body 1 via rotation of the toothed discs 211. The chain 212 of each of the first transmission modules 21 is oblong and has a straight section that is proximate to that of the chain 212 of the other one of the first transmission modules 21. The straight sections of the chains 212 of the first transmission modules 21 are parallel to and spaced apart from each other, and move at the same speed in the conveying direction (i.e., the two chains 212 of the carrying device 2 are rotated in opposite rotational directions in the same speed). Each of the second transmission modules 22 is structurally similar to the first transmission module 21, and includes a plurality of toothed discs 221 and a chain 222 trained on the toothed discs 221. In this embodiment, only the toothed discs 211, 221 (see FIG. 2) that are proximate to a central portion of the housing 6 are driven by motors 25 (only one is visible). The other toothed discs 211, 221 are subsequently driven to rotate via the chains 212, 222.

The carrying device 2 further includes a holding module 23 that is adapted for holding the circuit board 9 thereon. The holding module 23 includes a plurality of spikes 230 that protrude outwardly from outer surrounding surfaces of the chains 212, 222 of the first and second transmission modules 21, 22, and that are co-movable with the chains 212, 222. The circuit board 9 is clamped by the spikes 230 of the holding module 23 between the straight sections of the chains 212 or between the straight sections of the chains 222, during movement in the conveying direction.

The first stage is first performed after the circuit board 9 enters the housing 6 via the inlet 61. A portion of the circuit board 9 that is clamped between the chains 212 of the first transmission modules 21 is defined as a first portion 9A. The remaining portion of the circuit board 9 is defined as a second portion 9B. The second transmission modules 22 are disposed downstream of the first transmission modules 21 in the conveying direction for sequentially conveying the circuit board 9 in the conveying direction. The spikes 230 on the chains 222 of the second transmission modules 22 hold the second region 9B of the circuit board 9 when the circuit board 9 is clamped between the chains 222 of the second transmission modules 22. In this embodiment, the first region 9A is a lower portion of the circuit board 9, and the second portion 9B is the remaining portion of the circuit board 9.

It is noted that the carrying device 2 may be configured as a single-chain device. The holding module 23 may include, instead of the spikes 230, other holding structures for holding edges of the circuit board 9. Moreover, the circuit board 9 is not limited to be held upright, it may be inclined or horizontal when being clamped as long as the locations of the heating device 3 and brush device 4 are accordingly adjusted.

Referring to FIG. 2, the heating device 3 is disposed on the main body 1, and includes a first set of heaters 31 that are proximate to the first transmission modules 21 of the carrying device 2 and that correspond in position to the second portion 9B of the circuit board 9, and a second set of heaters 32 that are proximate to the second transmission modules 22 and that correspond in position to the first portion 9A of the circuit board 9. The heaters 31, 32 are configured as infrared tube heaters, and are adapted for heating up the circuit board 9 (e.g., up to 230° C.) to melt bonding material that bonds the electronic components 91 and the board body 90. In this embodiment, the bonding material may be solder, glue or other materials.

The brush device 4 is disposed on the main body 1, and includes a first brush set 41 that is proximate to the first transmission modules 21 of the carrying device 2 and that corresponds in position to the second portion 9B of the circuit board 9, and a second brush set 42 that is proximate to the second transmission modules 22 and that corresponds in position to the first portion 9A of the circuit board 9. The first brush set 41 includes a plurality of motors 411, a plurality of axle members 412 that are driven respectively by the motors 411, and a plurality of elongated brush bodies 413 that are made of heat-resistant material (e.g., steel) and that are connected co-rotatably to the axle members 412.

Since both of opposite surfaces of the board body 90 are mounted with the electronic components 91, in this embodiment, there are even number of motors 411 and even number of axle members 412. Each of the axle members 412 is mounted with a plurality of the brush bodies 413. Projections of the motors 411, the axle members 412 and the brush bodies 413 on the main body 1 are within two regions of the main body 1 that are respectively defined by projections of the chains 212 of the first transmission modules 21 on the main body 1. The second brush set 42 is structurally similar to the first brush set 41, includes even number of motors 421, even number of axle members 422, and a plurality of brush bodies 423 that are connected co-rotatably to the axle members 422. Projections of the motors 421, the axle members 422 and the brush bodies 423 on the main body 1 are within two regions of the main body 1 that are respectively defined by projections of the chains 222 of the second transmission modules 22 on the main body 1. The brush bodies 423 correspond in position to the first portion 9A of the circuit board 9. Each of the brush bodies 423 has a length less than that of each of the brush bodies 413. In this embodiment, the first brush set 41 includes four spaced-apart motors 411 (only two are visible in FIG. 2), and the second brush set 42 includes four spaced-apart motors 421 (only two are visible in FIG. 2). The brush bodies 413, 423 are driven to move relative to the opposite surfaces of the circuit board 9 by the motors 411, 421 and the axle members 412, 422 to remove the electronic components 91 from the board body 90.

The first set of heaters 31, the first brush set 41, the second set of heaters 32 and the second brush set 42 are arranged in sequence in the conveying direction. As such, the electronic components 91 of the second portion 9B of the circuit board 9 are first removed after the bonding material on the second portion 9B has been melted. Afterward, the electronic components 91 of the first portion 9A of the circuit board 9 are removed after the bonding material on the first portion 9A has been melted.

The receiving device 5 includes a conveying belt 51 that is disposed under the first set of heaters 31, the first brush set 41, the second set of heaters 41 and the second brush set 42, and that receives and conveys the melted bonding material and the electronic components 91 which are removed from the board body 90 toward the gathering outlet 63.

Figure 5:
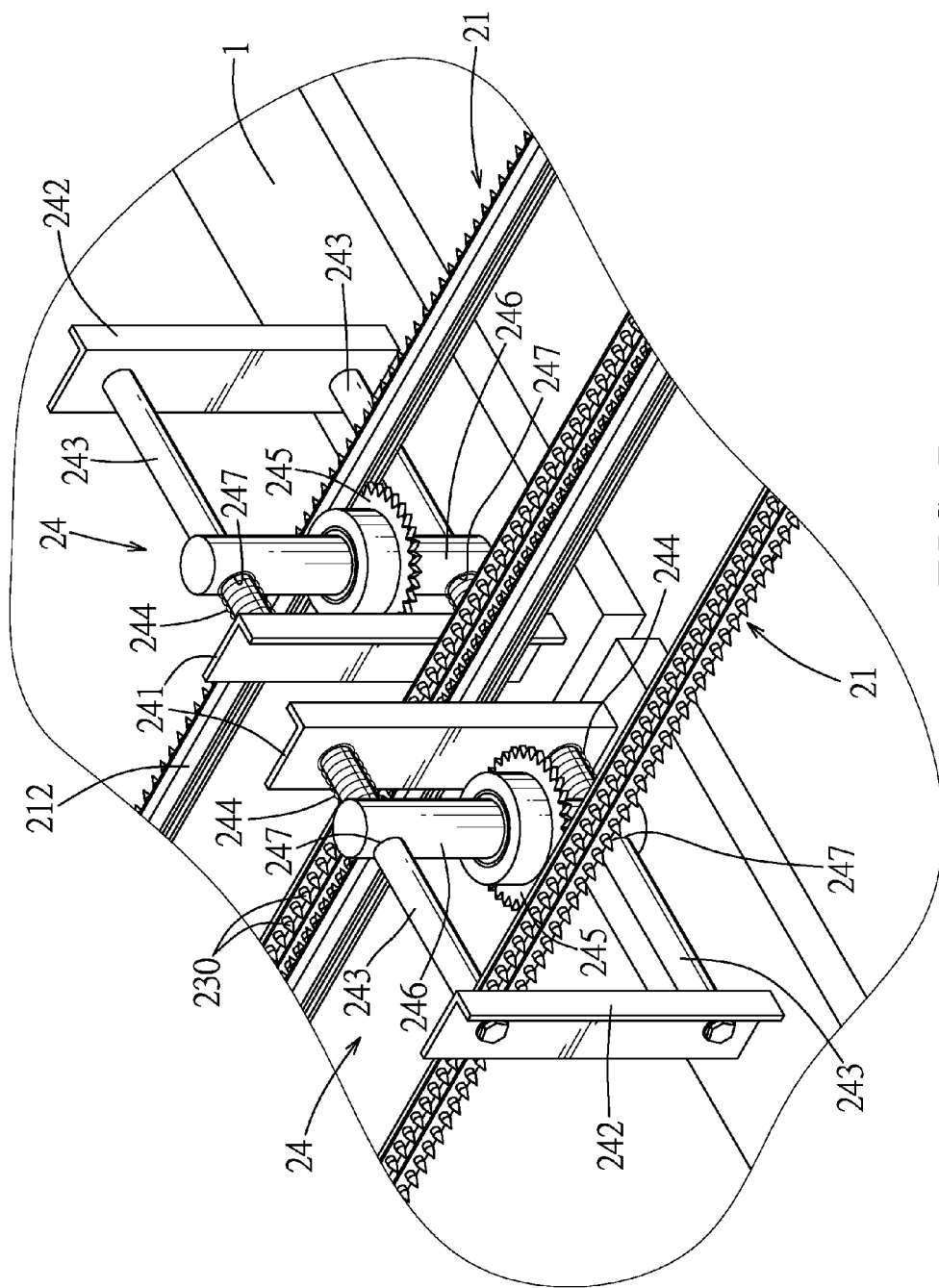
FIG. 5 is a fragmentary perspective view, illustrating a pair of tension-maintaining modules of the embodiment.

Referring to FIG. 5, in order to maintain tension in the chains 212, 222 to avoid the malfunction of the chains 212, 222 and the spikes 230 due to high temperature, the carrying device 2 further includes four tension-maintaining sub-modules 24 (only two are shown) that correspond respectively to the first and second transmission modules 21, 22 (only the first transmission modules 21 are illustrated in FIG.

5). It is noted that the number of the tension-maintaining sub-modules 24 may vary. For example, only the first transmission modules 21 that have longer chains (i.e., the chains 212) are provided respectively with the tension-maintaining sub-modules 24.

For one of the first transmission modules 21, the corresponding tension-maintaining sub-module 24 includes a first column 241 that is provided on the main body 1 and that is surrounded by the chain 212 of the first transmission module 21, a second column 242 that is provided on the main body 1 and that is disposed at a position outside of the chain 212 of the first transmission module 21 and opposite to the other one of the first transmission modules 21, two parallel connecting rods 243 that are connected between the first and second columns 241, 242, an auxiliary toothed disc member 245 that is disposed between the first and second columns 241, 242, that meshes the chain 212 of the first transmission module 21, and that is movable in a direction parallel to the connecting rods 243, and two springs 244 that are sleeved respectively around the connecting rods 243 and that bias resiliently the auxiliary toothed disc member 245 toward the second column 242 such that the chain 212 of the first transmission module 21 is tensed. In detail, the auxiliary toothed disc member 245 is mounted rotatably on a rod-shaped mounting seat 246. The mounting seat 246 has opposite end portions formed respectively with two through holes 247 through which the connecting rods 243 extend, respectively. The springs 244 are disposed between the first column 241 and the mounting seat 246 to bias the mounting seat 246 toward the second column 242. The configurations of the other tension-maintaining sub-modules 24 are identical to that of the abovementioned tension-maintaining sub-modules 24.

Referring back to FIG. 1, the cooling device 71 continues to provide cool air to the heating device 3 (see FIG. 2) to prevent overheat of the heating device 3.

During heating up the circuit board 9 (see FIG. 3), waste gas may be generated. The ventilating device 72 continues to draw waste gas out of the housing 6, and filter the waste gas before expelling it into the external environment.

To sum up, the removal apparatus 100 of this disclosure is capable of removing the electronic components 91 of the discarded circuit board 9 to obtain a bare board. The only manually-conducted step will be the feeding of the circuit board 9 into the removal apparatus 100, thereby preventing operators of the removal apparatus 100 from being burned under a high-temperature circumstance. Since the bare board has no stiff electronic components 91, the cutters for subsequently treating the bare board would have prolonged service lives.

While the present disclosure has been described in connection with what is considered the most practical embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A removal apparatus adapted for removing electronic components from a board body of a circuit board, said removal apparatus comprising:
    a main body;
    a carrying device disposed on said main body, and including a holding module that is adapted for holding the circuit board in such a manner that the circuit board is disposed upright and that said holding module holds two opposite lateral surfaces of the circuit board;
    a heating device disposed on said main body, being proximate to said carrying device, and adapted for heating up the circuit board to melt bonding material that bonds the electronic components and the board body; and
    a brush device disposed on said main body, being proximate to said carrying device, and including at least two brush bodies that are made of heat-resistant material, that are respectively located at two opposite lateral sides of said circuit board, and that are operable to respectively move relative to the opposite lateral surfaces of the circuit board to remove the electronic components from the board body after the bonding material is melted.

2. The removal apparatus as claimed in claim 1, wherein said carrying device further includes a pair of first transmission modules, each of said first transmission modules including a plurality of toothed discs that are mounted fixedly on said main body and that are rotatable respectively about central axes of the toothed discs, and a chain that is trained on said toothed discs and that is driven to rotate relative to said main body via rotation of said toothed discs, said chain of each of said first transmission modules having a straight section, said straight sections of said chains of said first transmission modules being parallel to and spaced apart from each other, and moving at the same speed in a conveying direction, said holding module being disposed co-movably on said chains, the circuit board being clamped by said holding module between said straight sections of said chains, and moved in the conveying direction.

3. The removal apparatus as claimed in claim 2, wherein said holding module includes a plurality of spikes that protrude outwardly from outer surrounding surfaces of said chains of said first transmission modules.

4. The removal apparatus as claimed in claim 2, wherein said heating device and said brush device are arranged in sequence in the conveying direction.

5. The removal apparatus as claimed in claim 2, further comprising a housing that contains said main body, said carrying device, said heating device and said brush device, said housing having one end that is formed with an inlet for feeding of the circuit board, and an opposite end that is formed with a board outlet for exit of the board body, the circuit board being clamped between said straight sections of said chains of said first transmission modules after entering said housing via said inlet.

6. The removal apparatus as claimed in claim 5, the circuit board being divided into first and second portions, wherein said chains of said first transmission modules of said carrying device are adapted for clamping the first portion of the circuit board therebetween, said heating device including a first set of heaters that are proximate to said first transmission modules and that correspond in position to the second portion of the circuit board, said brush device including a first brush set that is proximate to said first transmission modules and that corresponds in position to the second portion of the circuit board.

7. The removal apparatus as claimed in claim 6, wherein said carrying device further includes a pair of second transmission modules disposed downstream of said first transmission modules in the conveying direction for sequentially conveying the circuit board in the conveying direction, said second transmission modules of said carrying device being adapted for clamping the second portion of the circuit board therebetween, said heating device further including a second set of heaters that are proximate to said second transmission modules and that correspond in position to the first portion of the circuit board, said brush device further including a second brush set that is proximate to said second transmission modules and that corresponds in position to the first portion of the circuit board, said first set of heaters, said first brush set, said second set of heaters and said second brush set being arranged in sequence in the conveying direction.

8. The removal apparatus as claimed in claim 2, wherein each of said first transmission modules further includes at least one tension-maintaining sub-module including
- a first column that is provided on said main body and that is surrounded by said chain of said first transmission module,
- a second column that is provided on said main body and that is disposed at a position outside of said chain of said first transmission module and opposite to the other one of said first transmission modules,
- a connecting rod that is connected between said first and second columns,
- an auxiliary toothed disc member that is disposed between said first and second columns, that meshes said chain of said first transmission module, and that is movable in a direction parallel to said connecting rod, and
- a spring that is sleeved around said connecting rod and that biases resiliently said auxiliary toothed disc member toward said second column such that said chain of said first transmission module is tensed.

9. The removal apparatus as claimed in claim 2, wherein projections of said brush bodies on said main body are within two regions of said main body that are respectively defined by projections of said chains of said first transmission modules on said main body.

10. The removal apparatus as claimed in claim 9, wherein said brush device further includes a plurality of motors, and a plurality of axle members that are driven respectively by said motors, said brush bodies being connected respectively and co-rotatably to said axle members.

11. The removal apparatus as claimed in claim 1, further comprising a receiving device that is disposed under said heating device and said brush device for receiving the melted bonding material and the electronic components removed from the board body.

12. The removal apparatus as claimed in claim 11, further comprising a housing that contains said main body, said carrying device, said heating device and said brush device, said housing being formed with a gathering outlet, said receiving device including a conveying belt that is disposed under said heating device and said brush device, and that conveys the melted bonding material and the electronic components which have been removed from the board body toward said gathering outlet.

* * * * *